United States Patent
Sue et al.

(10) Patent No.: US 12,066,641 B2
(45) Date of Patent: Aug. 20, 2024

(54) OPTICAL UNIT WITH SHAKE CORRECTION FUNCTION AND PORTABLE DEVICE COMPRISING OPTICAL UNIT

(71) Applicant: NIDEC SANKYO CORPORATION, Nagano (JP)

(72) Inventors: Takeshi Sue, Nagano (JP); Tadashi Takeda, Nagano (JP); Shinji Minamisawa, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 482 days.

(21) Appl. No.: 17/530,459

(22) Filed: Nov. 19, 2021

(65) Prior Publication Data
US 2022/0179230 A1   Jun. 9, 2022

(30) Foreign Application Priority Data

Dec. 4, 2020 (CN) ......................... 202011414607.6

(51) Int. Cl.
| | |
|---|---|
| G02B 27/64 | (2006.01) |
| G02B 7/02 | (2021.01) |
| G03B 5/00 | (2021.01) |
| H04N 23/55 | (2023.01) |
| H04N 23/68 | (2023.01) |
| H05K 1/02 | (2006.01) |
| H05K 1/18 | (2006.01) |

(52) U.S. Cl.
CPC ............ *G02B 27/646* (2013.01); *G03B 5/00* (2013.01); *H04N 23/55* (2023.01); *H04N 23/687* (2023.01); *H05K 1/028* (2013.01); *H05K 1/181* (2013.01); *H05K 1/189* (2013.01); *G02B 7/02* (2013.01); *H05K 2201/053* (2013.01); *H05K 2201/10151* (2013.01)

(58) Field of Classification Search
None
See application file for complete search history.

(56) References Cited

U.S. PATENT DOCUMENTS

| | | | | |
|---|---|---|---|---|
| 2011/0103782 | A1* | 5/2011 | Tsuruta | ................ H04N 23/55 359/557 |
| 2019/0018258 | A1* | 1/2019 | Minamisawa | ....... H04N 23/687 |
| 2022/0137486 | A1* | 5/2022 | Oh | ...................... H04N 23/687 359/554 |

FOREIGN PATENT DOCUMENTS

WO   WO-2009133691 A1 * 11/2009 ........... G02B 13/001

\* cited by examiner

*Primary Examiner* — Derek S. Chapel
(74) *Attorney, Agent, or Firm* — JCIPRNET

(57) ABSTRACT

An optical unit with a shake correction function includes a movable module and a fixed body. The movable module has a lens and is supported by the fixed body to be capable of moving in a direction orthogonal to an optical axis of the lens. The fixed body surrounds the movable module from an outer periphery side. The movable module includes a first substrate and a second substrate, with a thickness direction of either substrate being consistent with the direction along the optical axis. An image sensor is disposed on the first substrate. The second substrate is electrically connected to the first substrate to overlap the first substrate on an image side, and is smaller in shape than the first substrate when viewed along the optical axis of the lens. A flexible printed circuit board is led out from an outer circumferential surface of the second substrate.

10 Claims, 6 Drawing Sheets

OPTICAL UNIT WITH SHAKE CORRECTION FUNCTION AND PORTABLE DEVICE COMPRISING OPTICAL UNIT

CROSS REFERENCE TO RELATED APPLICATION

The present invention claims priority under 35 U.S.C. § 119 to Chinese Application No. 202011414607.6 filed Dec. 4, 2020, and the entire content of which is incorporated herein by reference.

BACKGROUND

Field of the Invention

The present invention relates to an optical unit with a shake correction function and a portable device comprising the optical unit with a shake correction function.

Description of the Prior Art

In the past, there was provided an optical unit with a shake correction function. The optical unit includes a movable module and a fixed body, where the movable module has a lens and is supported by the fixed body in such a manner of being capable of moving in a direction orthogonal to an optical axis of the lens, and the fixed body surrounds the movable module from an outer periphery side, moreover, the movable module has a sensor substrate of which a thickness direction is consistent with a direction along the optical axis, and an image sensor (e.g., a charged coupled device (CCD)) is disposed on the sensor substrate. A flexible printed circuit board for connection with an external device is lead out from an outer circumferential surface of the sensor substrate.

However, in the optical unit with a shake correction function, with increasing pixels of the image sensor, the image sensor exhibits a trend of increasing in size, and so is the sensor substrate. Thus, the sensor substrate may protrude toward an outer periphery side relative to a main body including the lens in the movable module. Therefore, the flexible printed circuit board from the sensor substrate to a clamping position (a hole, a slit or the like in a wall of the fixed body that surrounds the movable module on the outer periphery side) or a target to be connected (e.g., a control circuit board of a master device (such as a mobile phone) for installation of the optical unit) will be shortened, resulting in reduced flexibility of the flexible printed circuit board and easy restriction on the motion of the movable module relative to the fixed body to affect the shake correction effect. If the flexible circuit board is designed to have the same length as before to ensure the flexibility of the flexibility printed circuit board, the size of the fixed body needs to be increased, which would result in an increase in size of the optical unit, thereby leading to an increase in size of a master device for installation of the optical unit.

SUMMARY

The present invention provides an optical unit with a shake correction function and a portable device including the optical unit. While a substrate, on which an image sensor is disposed, of a movable module is enlarged due to an increased size of the image sensor, the optical unit can be prevented from increase in size even though a flexible printed circuit board that connects the movable module with an external device needs to be lengthened.

The present invention provides an optical unit with a shake correction function, including a movable module and a fixed body. The movable module has a lens and is supported by the fixed body in such a manner of being capable of moving in a direction orthogonal to an optical axis of the lens. The fixed body surrounds the movable module from an outer periphery side. The movable module includes a first substrate and a second substrate, where a thickness direction of the first substrate is consistent with a direction along the optical axis; an image sensor is disposed on the first substrate; a thickness direction of the second substrate is consistent with the direction along the optical axis; the second substrate is electrically connected to the first substrate in such a manner of overlapping the first substrate on an image side, and is smaller in shape than the first substrate when viewed along the optical axis of the lens; and a flexible printed circuit board led out from an outer circumferential surface of the second substrate.

Here, "outer periphery side" and "circumferential direction" are both defined based on the optical axis of the lens.

In the optical unit with a shake correction function according to at least an embodiment of the present invention, the movable module includes the first substrate and the second substrate, where the thickness direction of the first substrate is consistent with the direction along the optical axis; the image sensor is disposed on the first substrate; the thickness direction of the second substrate is consistent with the direction along the optical axis; the second substrate is electrically connected to the first substrate in such a manner of overlapping the first substrate on the image side, and is smaller in shape than the first substrate when viewed along the optical axis L of the lens; and the flexible printed circuit board is led out from the outer circumferential surface of the second substrate. Therefore, while the first substrate is enlarged due to the increased size of the image sensor and the distance between the outer circumferential surface of the first substrate and the fixed body is reduced, it is also easy to prevent an increase in size of the optical unit even though the flexible printed circuit board that connects the movable module with an external device is lengthened to ensure sufficient flexibility of the flexible printed circuit board.

In addition, in the optical unit with a shake correction function according to at least an embodiment of the present invention, preferably, the flexible printed circuit board includes a radial extension portion and a circumferential extension portion. The radial extension portion extends from the outer circumferential surface of the second substrate to the outer periphery side, while the circumferential extension portion extends circumferentially from an end, on the outer periphery side, of the radial extension portion.

Here, the so-called "radial extension portion" is not strictly required to extend radially from the optical axis of the lens as long as it overall extends from the side of the optical axis of the lens to the outer periphery side. The so-called "circumferential extension portion" is not strictly required to extend circumferentially around the optical axis of the lens as long as it overall extends circumferentially around the optical axis of the lens.

In addition, in the optical unit with a shake correction function according to at least an embodiment of the present invention, the flexible printed circuit board includes the radial extension portion and the circumferential extension portion. The radial extension portion extends from the outer circumferential surface of the second substrate to the outer periphery side, while the circumferential extension portion extends circumferentially from the end, on the outer periphery side, of the radial extension portion. Therefore, in case of no circumferential extension portion, it would be easier to prevent the influence on shake correction due to restriction imposed by the flexible printed circuit board on the motion of the movable module relative to the fixed body when the flexible printed circuit board that connects the movable module with an external device is lengthened.

In addition, in the optical unit with a shake correction function according to at least an embodiment of the present invention, preferably, the second substrate is in a regular polygon shape; the optical axis of the lens passes through the center of the regular polygon shape; the radial extension portion extends from a position, on the side of the circumference, in a side of the regular polygon shape relative to the midpoint of the side; and the circumferential extension portion extends from the end, on the outer periphery side, of the radial extension portion to the other side in the circumferential direction.

In the optical unit with a shake correction function according to at least an embodiment of the present invention, the second substrate is in the regular polygon shape; the optical axis of the lens passes through the center of the regular polygon shape; the radial extension portion extends from a position, on the side of the circumference, in a side of the regular polygon shape relative to the midpoint of the side; and the circumferential extension portion extends from the end, on the outer periphery side, of the radial extension portion to the other side in the circumferential direction. Therefore, it would be easier to lengthen the flexible printed circuit board that connects the movable module with an external device and to prevent the influence on shake correction due to restriction imposed by the flexible printed circuit board on the motion of the movable module relative to the fixed body.

In addition, in the optical unit with a shake correction function according to at least an embodiment of the present invention, preferably, a plurality of flexible printed circuit boards are spaced apart at equal angle intervals around the optical axis of the lens.

In the optical unit with a shake correction function according to at least an embodiment of the present invention, the plurality of flexible printed circuit boards are spaced apart at equal angle intervals around the optical axis of the lens, and therefore, it would be easier to ensure balanced stress on the movable module and be conducive to driving the lens more accurately and correcting shake.

In addition, in the optical unit with a shake correction function according to at least an embodiment of the present invention, preferably, at least one of the plurality of flexible printed circuit boards is configured to transmit output signals from the image sensor; and the plurality of flexible printed circuit boards are the same in shape.

In the optical unit with a shake correction function according to at least an embodiment of the present invention, the plurality of flexible printed circuit boards are the same in shape, and therefore, it would be easy to reduce the manufacturing cost.

In addition, in the optical unit with a shake correction function according to at least an embodiment of the present invention, preferably, the second substrate is electrically connected to the first substrate by soldering.

In the optical unit with a shake correction function according to at least an embodiment of the present invention, the second substrate is electrically connected to the first substrate by soldering, and therefore, it would be easy to ensure the reliability of the electrical connection of the first substrate and the second substrate.

In addition, in the optical unit with a shake correction function according to at least an embodiment of the present invention, preferably, the fixed body includes a fixed body housing which forms a holding cavity for holding the movable module; the movable module includes a movable module housing in which the lens is held; the first substrate is fixed to the movable module housing on the image side, and is the same in shape as the movable module housing when viewed along the optical axis of the lens; the image sensor is disposed on a surface, on an object side, of the first substrate; and the second substrate is electrically connected to a central portion of the first substrate by means of ball grid array (BGA) packaging.

In addition, the optical unit with a shake correction function according to at least an embodiment of the present invention preferably includes a shake correction mechanism including: a magnet disposed on one of the movable module and the fixed body; and a coil disposed on the other of the movable module and the fixed body and coordinated with the magnet to allow the movable module to move relative to the fixed body.

In addition, the present invention provides a portable device including the optical unit with a shake correction function described above.

In addition, the portable device according to at least an embodiment of the present invention preferably includes a third substrate which is located on the image side of the optical unit; and the flexible printed circuit board configured to transmit output signals from the image sensor is electrically connected to the third substrate by means of a connector or by soldering at a position on the outer periphery side relative to the movable module.

According to at least an embodiment of the present invention, the movable module includes the first substrate and the second substrate, where the thickness direction of the first substrate is consistent with the direction along the optical axis; the image sensor is disposed on the first substrate; the thickness direction of the second substrate is consistent with the direction along the optical axis; the second substrate is electrically connected to the first substrate in such a manner of overlapping the first substrate on the image side, and is smaller in shape than the first substrate when viewed along the optical axis L of the lens; and the flexible printed circuit board is led out from the outer circumferential surface of the second substrate. Therefore, while the first substrate is enlarged due to the increased size of the image sensor and the distance between the outer circumferential surface of the first substrate and the fixed body is reduced, it is also easy to prevent an increase in size of the optical unit even though the flexible printed circuit board that connects the movable module with an external device is lengthened to ensure sufficient flexibility of the flexible printed circuit board.

DETAILED DESCRIPTION

Figure 1:
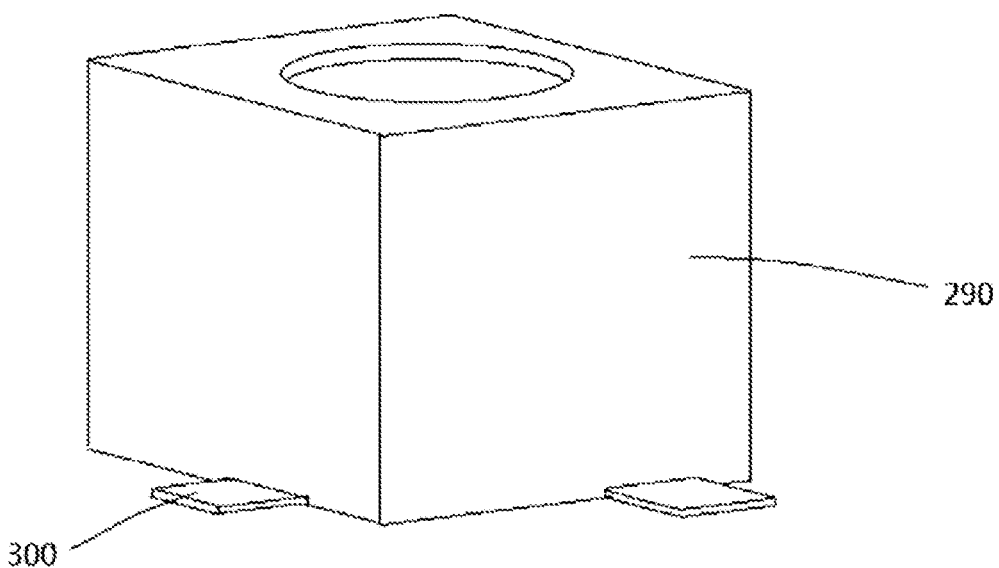
FIG. 1 is a three-dimensional external view of an optical unit with a shake correction function according to an embodiment of the present invention.
Figure 1:
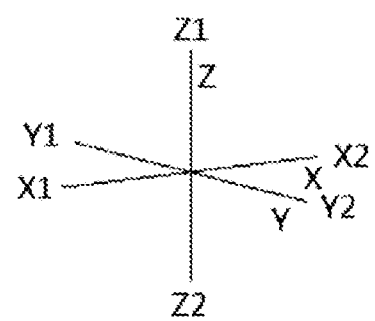
Figure 2:
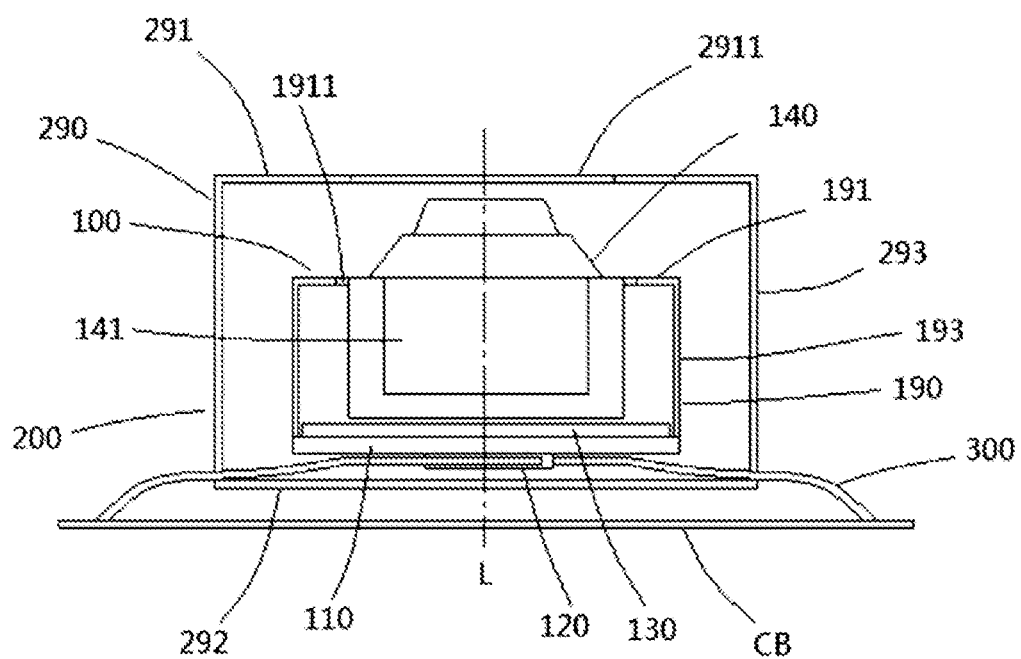
FIG. 2 is a side sectional view of an optical unit with a shake correction function according to an embodiment of the present invention, in which a circuit board of a master device allowing the optical unit to be installed thereon is illustrated.
Figure 3:
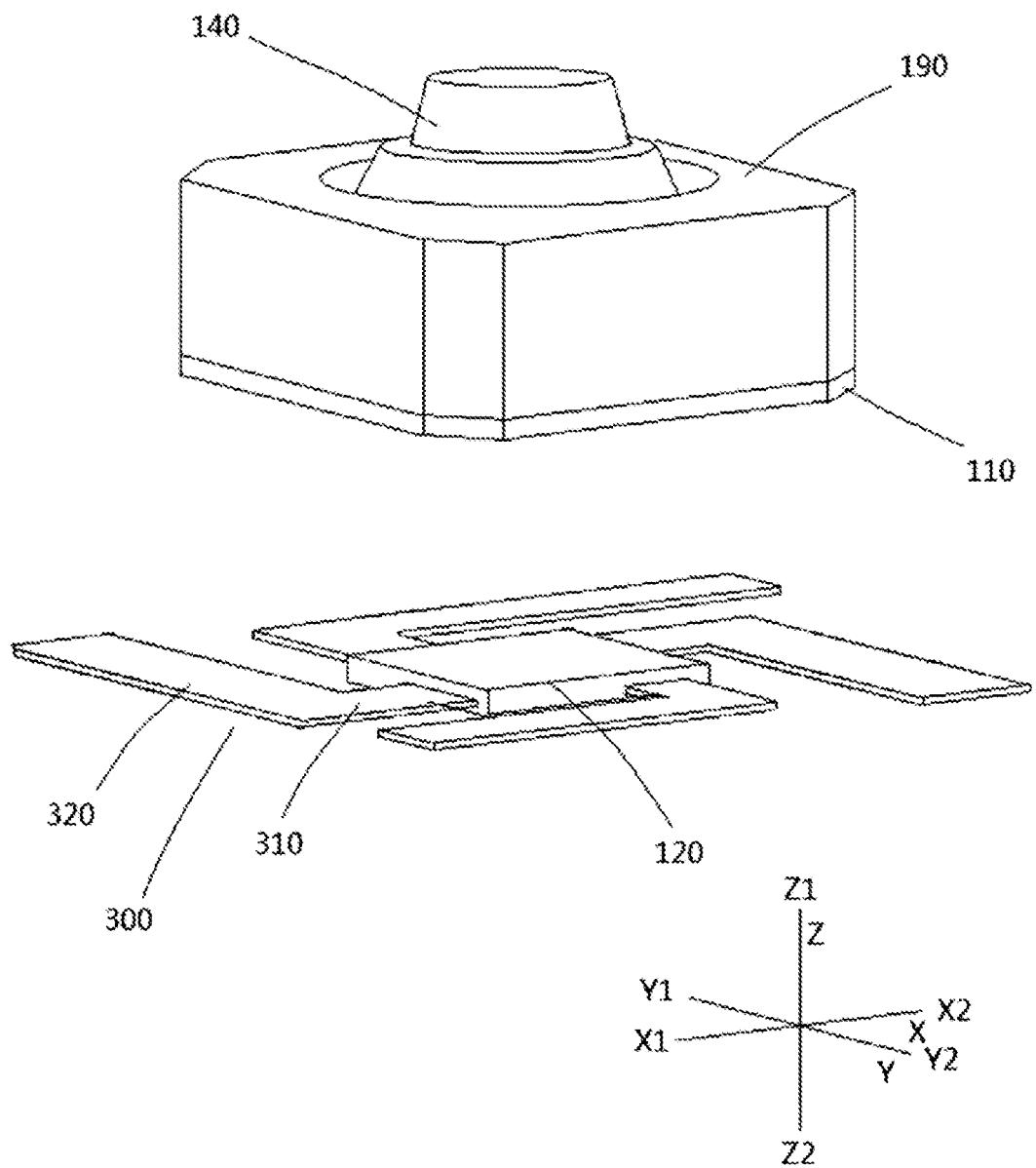
FIG. 3 is an exploded view of a movable module and a flexible printed circuit board in an optical unit with a shake correction function according to an embodiment of the present invention.
Figure 4:
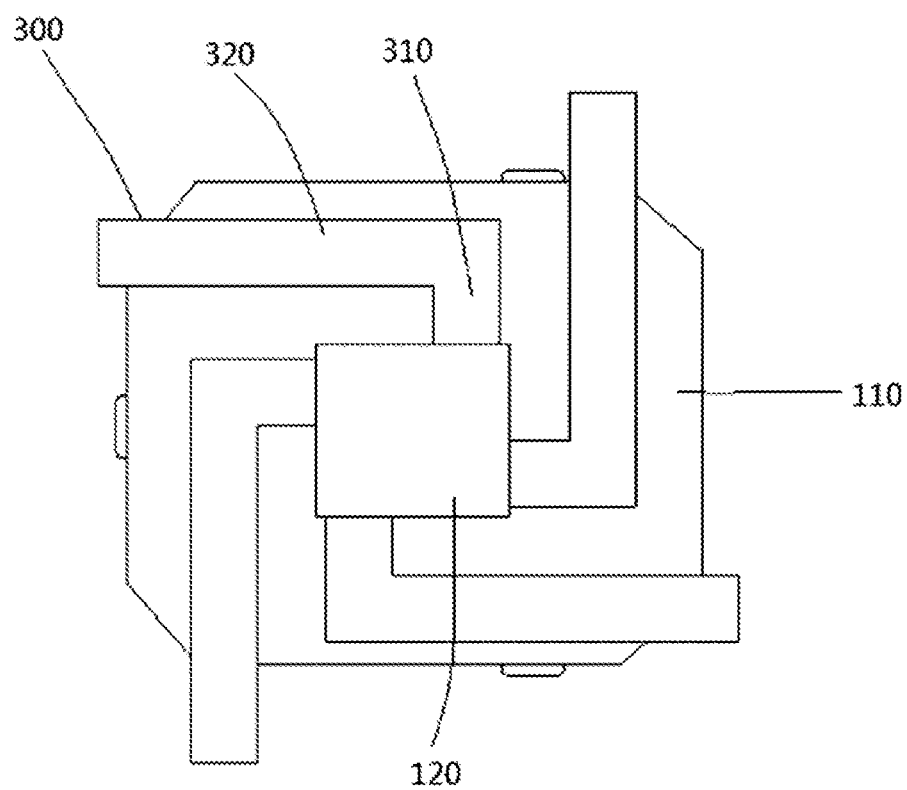
FIG. 4 is a bottom view of a movable module and a flexible printed circuit board in an optical unit with a shake correction function according to an embodiment of the present invention.
Figure 5:
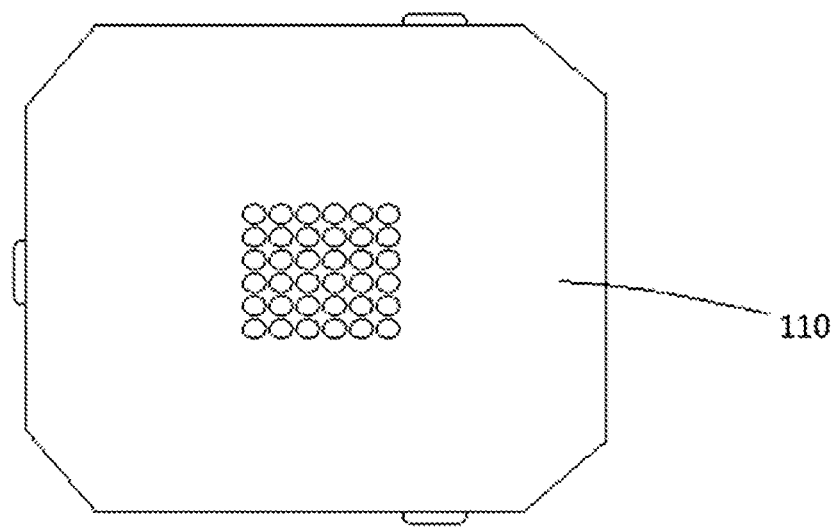
FIG. 5 is a bottom view of a movable module in an optical unit with a shake correction function according to an embodiment of the present invention, with a second substrate being removed.
Figure 5:
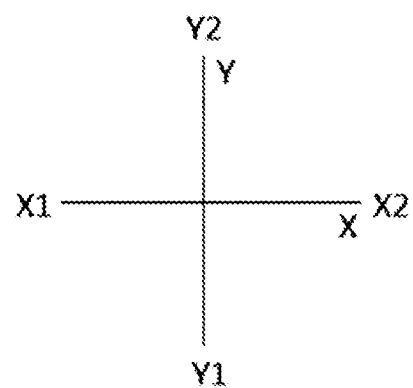
Figure 6:
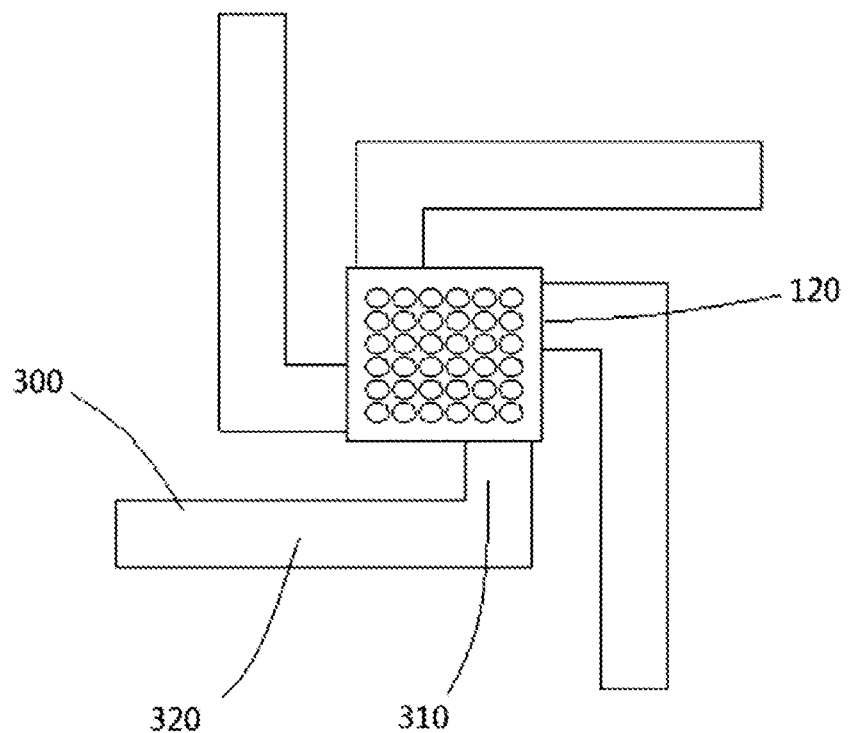
FIG. 6 is a top view of a second substrate of a movable module and a flexible printed circuit board in an optical unit with a shake correction function according to an embodiment of the present invention.

An optical unit with a shake correction function according to an embodiment of the present invention will be described in conjunction with FIG. 1. FIG. 1 is a three-dimensional external view of an optical unit with a shake correction function according to an embodiment of the present invention. FIG. 2 is a side sectional view of an optical unit with a shake correction function according to an embodiment of the present invention, in which a circuit board of a master device allowing the optical unit to be installed thereon is illustrated. FIG. 3 is an exploded view of a movable module and a flexible printed circuit board in an optical unit with a shake correction function according to an embodiment of the present invention. FIG. 4 is a bottom view of a movable module and a flexible printed circuit board in an optical unit with a shake correction function according to an embodiment of the present invention. FIG. 5 is a bottom view of a movable module in an optical unit with a shake correction function according to an embodiment of the present invention, with a second substrate being removed. FIG. 6 is a top view of a second substrate of a movable module and a flexible printed circuit board in an optical unit with a shake correction function according to an embodiment of the present invention.

For ease of description here, three mutually orthogonal directions are defined as X-direction, Y-direction and Z-direction. One side of the X-direction is defined as X1, while the other side of the X-direction is defined as X2. One side of the Y-direction is defined as Y1, while the other side of the Y-direction is defined as Y2. One side of the Z-direction is defined as Z1, while the other side of the Z-direction is defined as Z2. Moreover, the direction along an optical axis L of a lens is set to be the Z-direction, with Z1 being also referred to as an object side and Z2 as an image side.

(Overall Structure of Optical Unit with Shake Correction Function)

As shown in FIG. 1 and FIG. 2, an optical unit 1 with a shake correction function includes a movable module 100 and a fixed body 200. The movable module 100 has a lens 141 and is supported by the fixed body 200 in such a manner of being capable of moving in a direction orthogonal to the optical axis L of the lens 141. The fixed body 200 surrounds the movable module 100 from an outer periphery side. Moreover, as shown in FIG. 2 and FIG. 4, the movable module 100 includes a first substrate 110 and a second substrate 120. A thickness direction of the first substrate 110 is consistent with the direction along the optical axis L, and an image sensor 130 is disposed on the first substrate 110. A thickness direction of the second substrate 120 is consistent with the direction along the optical axis L, and the second substrate 120 is electrically connected to the first substrate 110 in such a manner of overlapping the first substrate 110 on the side of Z2 (i.e., the image side). Furthermore, as shown in FIG. 2 and FIG. 3, a flexible printed circuit board 300 is led out from an outer circumferential surface of the second substrate 120.

In addition, as shown in FIG. 1 and FIG. 2, the flexible printed circuit board 300 which is configured to transmit output signals from the image sensor is led out from the outer circumferential surface of the second substrate 120 to the outer periphery side.

In addition, FIG. 1 to FIG. 3, the movable module 100 includes a movable module housing 190 in which the lens 141 is held. Specifically, the movable module housing 190 is in a substantially cuboid shape as a whole and has a top cover portion 191 and a tubular portion 193. The top cover portion 191 is in a plate shape of which a thickness direction is consistent with the Z-direction. A window 1911 is formed in the center of the top cover portion 191. The tubular portion 193 extends from the periphery of the top cover portion 191 to the side of Z2. Moreover, the first substrate 110 is abutted against an end, located on the side of Z2, of the tubular portion 193 from the side of Z2 and fixed to the movable module housing 190. When viewed along the optical axis L of the lens 141, the shape of the first substrate 110 is the same as that of the movable module housing 190. A main body of a lens unit 140 including the lens 141 is held in a holding cavity formed by the top cover portion 191, the tubular portion 193 and the first substrate 110. The main body of the lens unit 140 is held in the holding cavity, for example, in such a manner of being capable of moving in the Z-direction. The lens unit 140 further has a protrusion that extends from the main body of the lens unit 140 to the side of Z1 and protrudes from the window 1911.

In addition, as shown in FIG. 2, the image sensor 130 is disposed on a surface, on the side of Z1, of the first substrate 110. Specifically, the first substrate 110 is in a substantially square shape, and the optical axis L of the lens 141 passes through the center of the square shape. The image sensor 130 is disposed at the center of the surface, on the side of Z1, of the first substrate 110. A pin of the image sensor 130 is, for example, soldered to a pad on the surface, on the side of Z1, of the first substrate 110. When viewed in the Z-direction, the image sensor 130 is, for example, in a substantially square shape. The image sensor 130 is slightly smaller in size than the first substrate 110.

In addition, as shown in FIG. 2 and FIG. 4, the second substrate 120 is electrically connected to the first substrate 110 by soldering. Specifically, the second substrate 120 is in a substantially square shape, and the optical axis L of the lens 141 passes through the center of the square shape. The second substrate 120 is electrically connected to the central portion of the first substrate 110 by means of ball grid array (BGA) packaging.

In addition, as shown in FIG. 3, FIG. 4 and FIG. 6, the flexible printed circuit board 300 includes a radial extension portion 310 and a circumferential extension portion 320. The radial extension portion 310 extends from the outer circumferential surface of the second substrate 120 to the outer periphery side, while the circumferential extension portion 320 extends circumferentially from an end, on the outer periphery side, of the radial extension portion 310. Specifically, as shown in FIG. 3, FIG. 4 and FIG. 6, the radial extension portion 310 extends from a position, on the side of the circumference (e.g., clockwise side in FIG. 4), in a side of the above-mentioned square shape relative to the midpoint of the side (specifically referring to the side, close to the circumference, of the midpoint of the radial extension portion 310 in a width direction thereof relative to the midpoint of the side of the square shape). The circumferential extension portion 320 extends from an end, on the outer periphery side, of the radial extension portion 310 to the other side in the circumferential direction (e.g., counterclockwise side in FIG. 4). Moreover, four flexible printed circuit boards 300 are spaced apart at equal angle intervals around the optical axis L of the lens 141. Moreover, the four flexible printed circuit boards 300 are the same in shape.

In addition, as shown in FIG. 1, the fixed body 200 includes a fixed body housing 290 that forms a holding cavity for holding the movable module 100. Specifically, the fixed body housing 290 is in a substantially cuboid shape as a whole and includes a top cover portion 291, a base portion 292 and a tubular portion 293. The top cover portion 291 is in a plate shape of which a thickness direction is consistent with the Z-direction. A window 2911 is formed in the center of the top cover portion 291, allowing light from an object to pass therethrough into the lens 141 of the movable module 100. The base portion 292 is in a plate shape of which a thickness direction is consistent with the Z-direction, and on the side of Z2, is spaced apart from and opposite to the top cover portion 291. The outer periphery of the top cover portion 291 and the outer periphery of the base portion 292 are connected by the tubular portion 293, so that the top cover portion 291, the base portion 292 and the tubular portion 293 form a holding cavity for holding the movable module 100. Moreover, a slit for leading out the flexible printed circuit board 300 from the above-mentioned holding cavity is formed between the tubular portion 293 and the base portion 292. At the slit, the surface, on the side of Z1, of the flexible printed circuit board 300 is abutted against the tubular portion 293, while the surface, on the side of Z2, of the flexible printed circuit board 300 is abutted against the base portion 292, whereby the flexible printed circuit board 300 is restricted from moving in the Z-direction.

In addition, as shown in FIG. 2, after being led out from the holding cavity within the fixed body housing 290 via the slit between the tubular portion 293 and the base portion 292, the flexible printed circuit board 300 is electrically connected to a third substrate CB of a master device (e.g., a portable device such as a mobile phone) for installation of the optical unit 1 at a position on the outer periphery side relative to the movable module 100. Specifically, the third substrate CB is located on the base portion 292 on the side of Z1, and the flexible printed circuit board is electrically connected to the third substrate CB of the master device for installation of the optical unit 1, for example, by means of a connector or by soldering at a position on the outer periphery side relative to the optical unit 1.

In addition, although not illustrated, the optical unit 1 with a shake correction function further includes a shake correction mechanism including: a magnet disposed on one of the movable module 100 and the fixed body 200 (e.g., disposed on one of an outer circumferential surface of the movable module 100 and an inner circumferential surface of the fixed body 200); and a coil disposed on the other of the movable module 100 and the fixed body 200 (e.g., disposed on the other of the outer circumferential surface of the movable module 100 and the inner circumferential surface of the fixed body 200) and coordinated with the magnet to allow the movable module 100 to move relative to the fixed body 200.

Major Effects of the Embodiment

In the optical unit 1 with a shake correction function according to the embodiment, the movable module 100 includes the first substrate 110 and the second substrate 120. The thickness direction of the first substrate 110 is consistent with the direction along the optical axis L, and the image sensor 130 is disposed on the first substrate 110. The thickness direction of the second substrate 120 is consistent with the direction along the optical axis L, and the second substrate 120 is electrically connected to the first substrate 110 in such a manner of overlapping the first substrate 110 on the side of Z2, and is smaller in shape than the first substrate 110 when viewed along the optical axis L of the lens 141. Furthermore, the flexible printed circuit board 300 is led out from the outer circumferential surface of the second substrate 120. Therefore, while the first substrate 110 is enlarged due to the increased size of the image sensor 130 and the distance between the outer circumferential surface of the first substrate 110 and the fixed body 200 is reduced, it is also easy to prevent an increase in size of the optical unit 1 even though the flexible printed circuit board 300 that connects the movable module 100 with an external device is lengthened to ensure sufficient flexibility of the flexible printed circuit board 300.

The present invention is described above by way of example with reference to the drawings. Apparently, specifically embodiments of the present invention are not limited to the above embodiment.

For example, in the above embodiment, the movable module housing 190 is in the substantially cuboid shape as a whole, and the fixed body housing 290 is in the substantially cuboid shape as a whole. However, the movable module housing 190 and the fixed body housing 290 are not limited to this shape and can be approximately changed in shape as needed, for example, formed in a substantially cylindrical shape.

In addition, in the above embodiment, the flexible printed circuit board 300 is configured to transmit output signals from the image sensor. However, the flexible printed circuit board 300 is not limited to this type and can also be a circuit board for supplying power.

In addition, in the above embodiment, when viewed along the optical axis L of the lens 141, the shape of the first substrate 110 is the same as that of the movable module housing 190. However, the shape of the first substrate 110 when viewed along the optical axis L of the lens 141 is not limited to be the same as that of the movable module housing 190, and the first substrate 110 can be different in both shape and size from the movable module housing 190.

In addition, in the above embodiment, the first substrate 110 is in the substantially square shape, and the optical axis L of the lens 141 passes through the center of the square shape. The image sensor 130 is disposed at the center of the surface, on the side of Z1, of the first substrate 110. However, the shape and position of the first substrate 110 and the location of the image sensor 130 on the first substrate 110 are not limited to those mentioned above and can be approximately adjusted as required in practice.

In addition, in the above embodiment, the second substrate 120 is in the substantially square shape, and the optical axis L of the lens 141 passes through the center of the square shape. The second substrate 120 is electrically connected to the central portion of the first substrate 110 by means of ball grid array (BGA) packaging. However, the shape and position of the second substrate 120 and the connection mode of the second substrate 120 and the first substrate 110 are not limited to those mentioned above and can be approximately adjusted as required in practice.

In addition, in the above embodiment, the flexible printed circuit board 300 includes the radial extension portion 310 and the circumferential extension portion 320. However, the flexible printed circuit board 300 is not limited to this structure and may include only the radial extension portion 310.

In addition, in the above embodiment, four flexible printed circuit boards 300 are spaced apart at equal angle intervals around the optical axis L of the lens 141. Furthermore, the four flexible printed circuit boards 300 are the same in shape. However, the number, arrangement form and shapes of the flexible printed circuit boards 300 are not limited to those mentioned above and can be approximately adjusted as required in practice.

In addition, in the above embodiment, the slit for leading out the flexible printed circuit board 300 from the holding cavity is formed between the tubular portion 293 and the base portion 292. However, the slit is not limited to this position. The slit (or a hole) for leading out the flexible printed circuit board 300 can also be formed in the tubular portion 293. Alternatively, the slit (or a hole) for leading out the flexible printed circuit board 300 can also be formed in other positions.

It should be noted that different parts of embodiments can be freely combined or approximately modified or omitted within the scope of the present invention.

What is claimed is:

1. An optical unit with a shake correction function, comprising a movable module and a fixed body, with the movable module having a lens and being supported by the fixed body in such a manner of being capable of moving in a direction orthogonal to an optical axis of the lens, and the fixed body surrounding the movable module from an outer periphery side, wherein:
   the movable module comprises:
   a first substrate, wherein a thickness direction of the first substrate is consistent with a direction along the optical axis, and an image sensor is disposed on the first substrate; and
   a second substrate, wherein a thickness direction of the second substrate is consistent with the direction along the optical axis, the second substrate is electrically connected to the first substrate in such a manner of overlapping the first substrate on an image side, and is smaller in shape than the first substrate when viewed along the optical axis of the lens; and
   a flexible printed circuit board led out from an outer circumferential surface of the second substrate.

2. The optical unit with a shake correction function according to claim 1, wherein:
   the flexible printed circuit board comprises a radial extension portion and a circumferential extension portion;
   the radial extension portion extends from the outer circumferential surface of the second substrate to the outer periphery side; and
   the circumferential extension portion extends circumferentially from an end, on the outer periphery side, of the radial extension portion.

3. The optical unit with a shake correction function according to claim 2, wherein:
   the second substrate is in a regular polygon shape;
   the optical axis of the lens passes through a center of the regular polygon shape;
   the radial extension portion extends from a position, on a side of a circumference, in a side of the regular polygon shape relative to a midpoint of the side; and
   the circumferential extension portion extends from the end, on the outer periphery side, of the radial extension portion to an other side in the circumferential direction.

4. The optical unit with a shake correction function according to claim 1, wherein:
   a plurality of flexible printed circuit boards are spaced apart at equal angle intervals around the optical axis of the lens.

5. The optical unit with a shake correction function according to claim 4, wherein:
   at least one of the plurality of flexible printed circuit boards is configured to transmit output signals from the image sensor; and
   the plurality of flexible printed circuit boards are the same in shape.

6. The optical unit with a shake correction function according to claim 1, wherein:
   the second substrate is electrically connected to the first substrate by soldering.

7. The optical unit with a shake correction function according to claim 1, wherein:
   the fixed body comprises a fixed body housing;
   the fixed body housing forms a holding cavity for holding the movable module;
   the movable module comprises a movable module housing;
   the lens is held in the movable module housing;
   the first substrate is fixed to the movable module housing on the image side, and is the same in shape as the movable module housing when viewed along the optical axis of the lens;
   the image sensor is disposed on a surface, on an object side, of the first substrate; and
   the second substrate is electrically connected to a central portion of the first substrate by means of ball grid array packaging.

8. The optical unit with a shake correction function according to claim 1, further comprising:
   a shake correction mechanism,
   the shake correction mechanism comprising:
   a magnet disposed on one of the movable module and the fixed body; and
   a coil disposed on the other of the movable module and the fixed body and coordinated with the magnet to allow the movable module to move relative to the fixed body.

9. A portable device, comprising the optical unit with a shake correction function according to claim 1.

10. The portable device according to claim 9, further comprising:
    a third substrate,
    wherein the third substrate is located on the image side of the optical unit; and
    the flexible printed circuit board configured to transmit output signals from the image sensor is electrically connected to the third substrate by means of a connector or by soldering at a position on the outer periphery side relative to the movable module.

* * * * *